United States Patent [19]

Yamashita et al.

[11] Patent Number: 5,021,225

[45] Date of Patent: Jun. 4, 1991

[54] CRYSTAL PULLING APPARATUS AND CRYSTAL PULLING METHOD USING THE SAME

[75] Inventors: Youji Yamashita, Yokohama; Masakatu Kojima, Yokosuka, both of Japan

[73] Assignee: Kabushiki Kaisha Toshiba, Kawasaki, Japan

[21] Appl. No.: 312,847

[22] Filed: Feb. 21, 1989

[30] Foreign Application Priority Data

Feb. 22, 1988 [JP] Japan .................................. 63-39152

[51] Int. Cl.⁵ ...................... C30B 35/00; C30B 15/12
[52] U.S. Cl. ................................ 422/249; 156/617.1; 156/620.4; 156/DIG. 64
[58] Field of Search ................... 156/608, 617.1, 620.4, 156/DIG. 64; 422/245, 248, 249

[56] References Cited

U.S. PATENT DOCUMENTS

| | | | |
|---|---|---|---|
| 2,809,136 | 10/1957 | Mortimer | 156/608 |
| 3,078,151 | 2/1963 | Kappelmeyer | 422/249 |
| 3,716,345 | 2/1973 | Grabmaier | 422/249 |
| 4,036,595 | 7/1977 | Lorenzini et al. | 422/249 |
| 4,190,631 | 2/1980 | Dewees et al. | 156/608 |
| 4,246,064 | 1/1981 | Dewees et al. | 156/608 |
| 4,353,875 | 10/1982 | Yancey | 422/249 |
| 4,378,269 | 3/1983 | Matsushita et al. | 156/617 SP |
| 4,456,499 | 6/1984 | Lin | 156/608 |
| 4,609,425 | 9/1986 | Mateika et al. | 156/617.1 |
| 4,659,421 | 4/1987 | Jewett | 156/608 |
| 4,734,267 | 3/1988 | Kojima | 422/249 |
| 4,894,206 | 1/1990 | Yamashita et al. | 422/249 |

FOREIGN PATENT DOCUMENTS 0261498 3/1988 European Pat. Off. .
2152801 3/1972 Fed. Rep. of Germany .
66528 3/1957 France .
58-172290 10/1958 Japan .

OTHER PUBLICATIONS

H. F. Matare, "General Considerations Concerning The Double-Crucible Method to Grow Uniformly Doped Germanium Crystals of High Perfection", *Solid State Electronics*, vol. 6, pp. 163–167 (1963).

Brice, J. C., "Crystal Growth Processes", Halsted Press, John Wiley and Sons, New York, 1986.

*Primary Examiner*—Gary P. Straub
*Assistant Examiner*—Stephen G. Kalinchak
*Attorney, Agent, or Firm*—Finnegan, Henderson, Farabow, Garrett, and Dunner

[57] ABSTRACT

In a crystal pulling process using an integral type double crucible, a cylindrical separation wall is mounted in and is coaxial with a crucible, for receiving semiconductor material melt to divide the crucible into inner and outer chambers. A coupling tube fixed at the side wall of the separation wall and having a pipe-like passage with a small hole is provided to make a pass between the inner and outer chambers. While material melt in the outer chamber is being supplied to the inner chamber via the coupling tube, crystal is pulled from the melt received in the inner chamber and having an impurity composition different from that of the melt in the outer chamber.

21 Claims, 11 Drawing Sheets

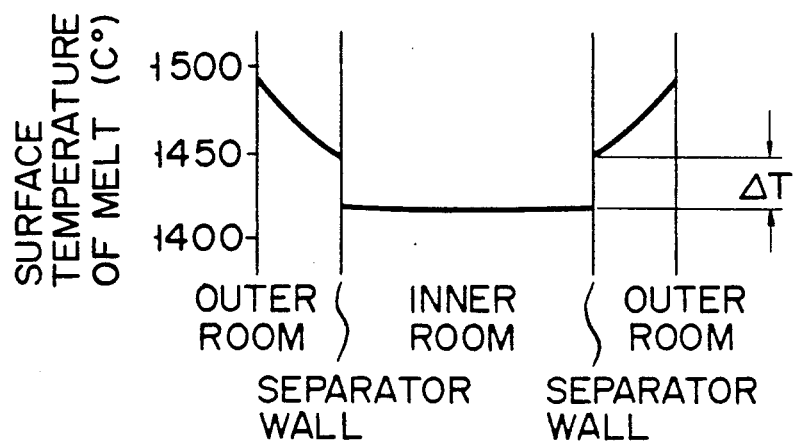
F I G. 7A
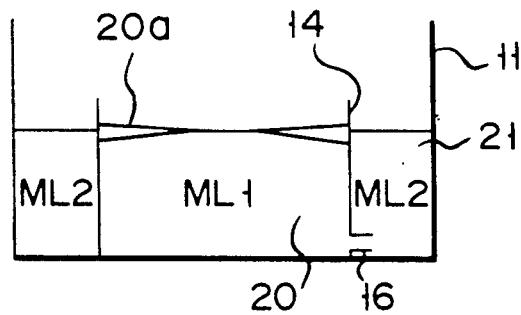
F I G. 7B

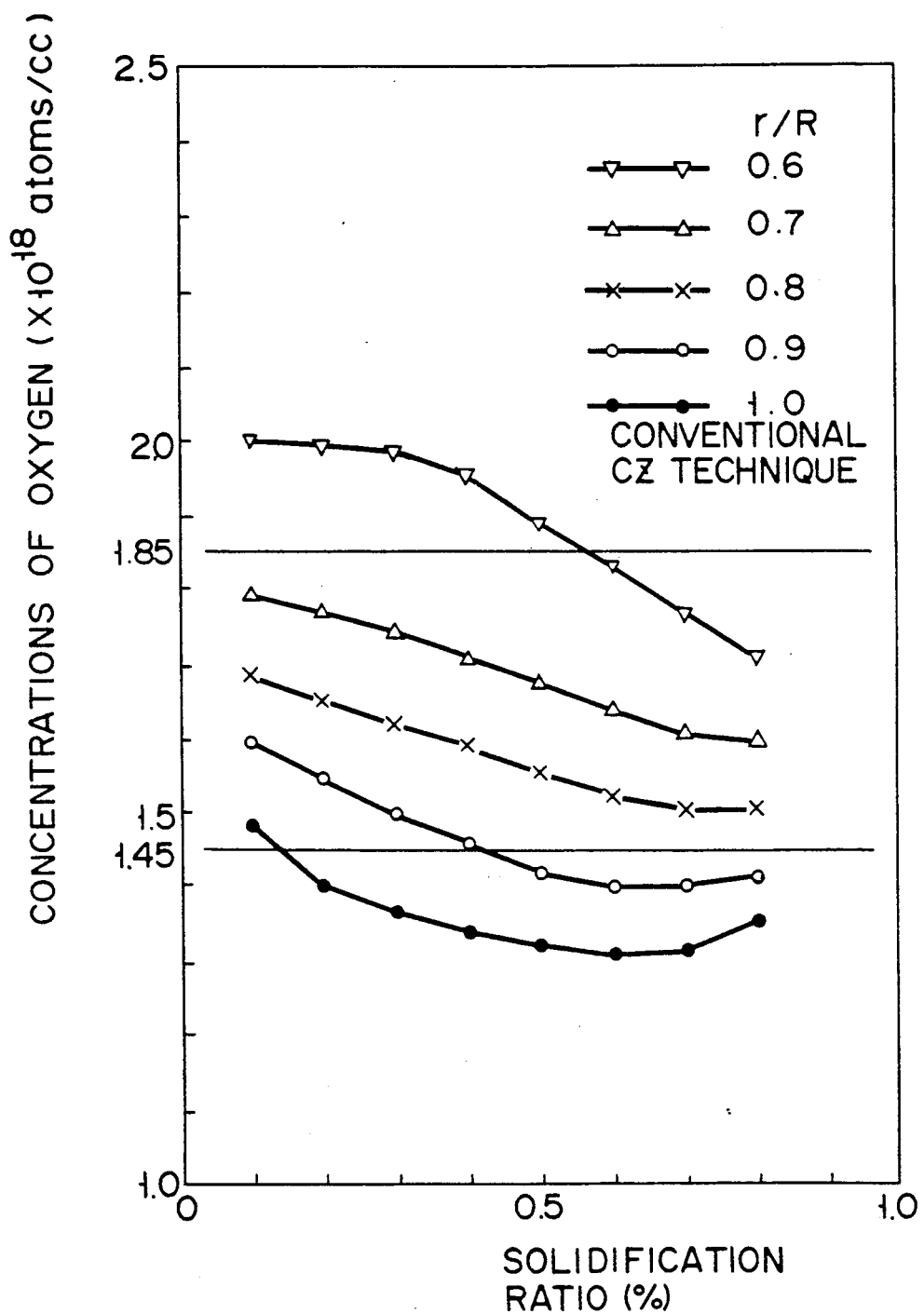
F I G. 10

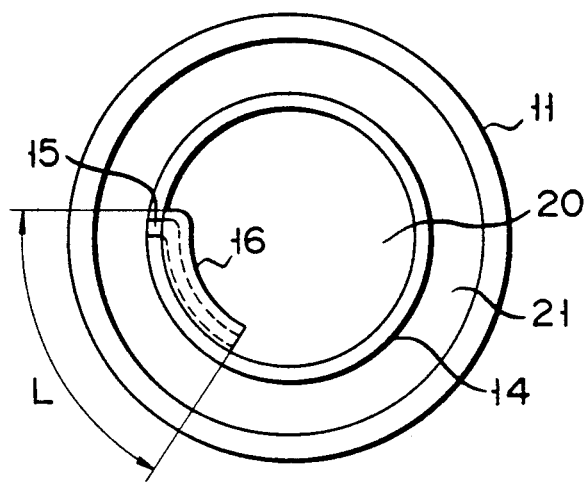
F I G. 15
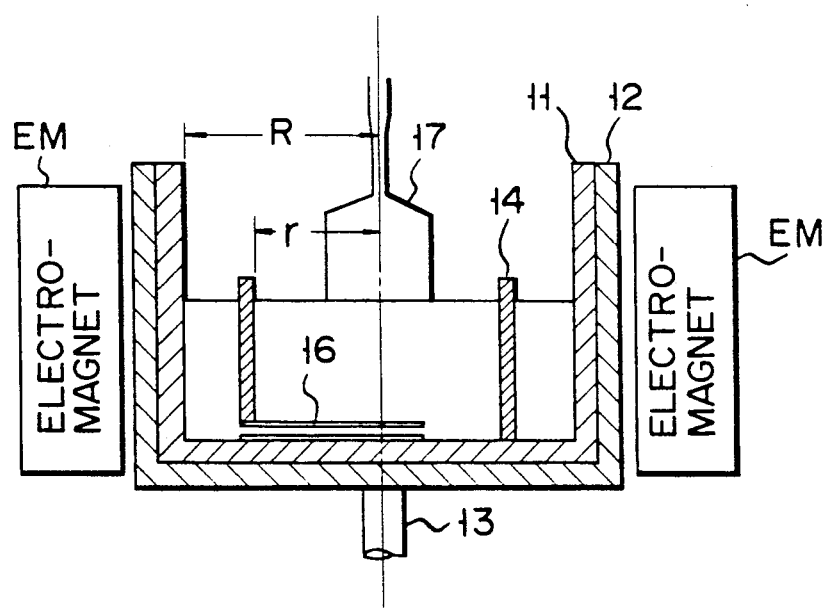
F I G. 16

CRYSTAL PULLING APPARATUS AND CRYSTAL PULLING METHOD USING THE SAME

BACKGROUND OF THE INVENTION

1. Field of the Invention

This invention relates to a method for pulling semiconductor crystals such as silicon crystals and, more particularly, to an apparatus having a double structure crucible which is divided into inner and outer chambers, and a method for controlling the resistivity and other crystal characteristics by means of the crystal pulling apparatus.

2. Description of the Related Art

Conventionally, the Czochralski technique (CZ technique) is a known method used to grow a rod-like semiconductor single crystal from melt in a crucible, and as is well known in the art, the impurity concentration distribution C in the longitudinal direction of the single crystal grown by use of this method can be expressed as follows:

$$C = kC_0(1-G)^{k-1}$$

where k is the segregation coefficient of the dopant, $C_0$ is the initial impurity concentration of the melt, and G is the solidification ratio. When the value of k is low, the impurity concentration distribution in the longitudinal direction of the grown single crystal varies significantly, as a result of which, the yield of single crystal having the desired impurity concentration range (or resistivity range when the impurity is an electrically active material; i.e. the conductive impurity) may be significantly reduced.

With the aim of solving this problem, a floating type double crucible method, in which the surface level of the melt in an inner crucible is kept constant, has been proposed for use in growing single crystal of germanium or silicon, and is disclosed in the following document:

Solid-State Electronics Program Press 1963. Vol 6, pp. 163-167. Printed in Great Britain GENERAL CONSIDERATIONS CONCERNING THE DOUBLE-CRUCIBLE METHOD TO GROW UNIFORMLY DOPED GERMANIUM CRYSTALS OF HIGH PRECISION

H.F.MATARE

Bendix Research Laboratories Division, Southfield, Mich.

(Received 10 September 1962; in revised form 8 November 1962)

The double-crucible method will now be explained in detail, with reference to FIG. 14. As is shown in FIG. 14, inner crucible 2 is arranged as a floating crucible inside outer crucible 1, with small hole 3 being formed in the bottom of inner crucible 2. When, for example, crystal 6 is pulled from melt 4 in inner crucible 2, the balance between the buoyancy of inner crucible 2 and the force of gravity is utilized to maintain the surface level h of the melt in the inner crucible. Further, the outer crucible is raised relative to the fixed inner crucible, so as to supply melt 5 from the outer crucible to the inner crucible in such a way that the surface level h of the melt in the inner crucible is kept constant. Assuming that the impurity concentration of melt 5 in the outer crucible is $C_0$, and that the impurity concentration of melt 4 in the inner crucible is $C_0/k$ (k being the segregation coefficient), then in the pulling process, in which surface level h of the melt is kept constant, the concentration of impurity taken into pulling crystal 6 becomes $C_0$, thus ensuring that the melt (pure silicon or germanium) and the impurity used for growing the crystal are always supplied in equal amounts from melt 5 in the outer crucible to melt 4 in the inner crucible. As a result, the impurity concentration of melt 4 in the inner crucible is kept at $C_0/k$, and thus the impurity concentration of pulling crystal 6 is kept at constant value $C_0$.

However, in the pulling process, some of the melt is consumed and the surface level thereof is lowered. After the bottom outer portion of inner crucible 2 comes into contact with the bottom inner portion of outer crucible 1, the impurity concentration cannot be kept constant, and thus the impurity concentration of crystal 6 will vary (i.e. increase) as the solidification ratio increases. More precisely, the impurity concentration can be kept constant only within the following range of the solidification ratio G:

$$0 \leq G \leq 1 - (h/H) \qquad (1)$$

where H is the initial surface level of the melt in the outer crucible, and h is the surface level of the melt in the inner crucible, to be kept constant during the pulling process. Therefore, in the case where the floating type double-crucible method is effected by using an impurity acting as a donor or acceptor to grow a crystal having a constant resistivity in the longitudinal direction, the resistivity can be kept constant only when the solidification ratio is less than 0.6 to 0.7, the resistivity varying significantly after the solidification ratio becomes higher than this value.

Another single crystal growing method is the floating zone technique (FZ technique), and according to this technique, it is possible to grow a rod-like single crystal having a constant impurity concentration in the longitudinal direction. However, it is generally the case that the distribution of the dopant impurity in the radial cross section of a single crystal obtained by way of the FZ technique is non-uniform in comparison with a single crystal obtained by way of the CZ technique. For example, in the case of a Si single crystal wafer of 5"φ, the growing direction (111) of which is represented by Miller indices, the in-plane distribution $\Delta\rho$ of resistivity $\rho$ attained by resistivity measurement using four probes is 6 to 15% when the CZ technique is used, but reaches as high as 20 to 50% when the FZ technique is used. In this case, $\Delta\rho = (\rho max \times \rho min)/\rho min$, the in-plane resistance variation $\Delta\rho SR$ caused by the spreading resistance measurement being 10 to 20% in the CZ crystal, but reaching as high as 30 to 50% in the FZ crystal.

When the CZ technique is used to grow a silicon single crystal, oxygen having $1 \times 10^{18}$ atoms/cc is introduced from the quartz crucible containing the melt into the crystal, while when the FZ technique is used, introduction of oxygen is suppressed to a minimum, since the melt is not in direct contact with the crucible. Since the introduction of oxygen into the silicon crystal tends to harden the wafer, therefore a wafer obtained by use of the FZ technique,—i.e. one containing less oxygen, and therefore more soft—tends to become warped during the heat treatment, and slippage occurs more easily than in the case where a wafer is obtained by way of the CZ technique.

In order to solve the problems associated with the CZ technique, the floating type double-crucible method, and the FZ technique; the inventors of the present invention have proposed a crystal pulling apparatus having a novel integral type double crucible structure (cf. Japanese Patent Application No. 61-221896 which corresponds to U.S. Patent Application, Ser. No. 091,947 filed on Sept. 1, 1987. The copending related Japanese Patent Applications are Japanese Patent Application Nos. 61-238034, 62-200839, and 62-229632). The present invention improves the invention of the above-quoted patent applications.

SUMMARY OF THE INVENTION

An object of this invention is to provide a crystal pulling apparatus by means of which the radial-direction resistivity of a grown semiconductor single crystal is relatively constant and the resistivity in the longitudinal direction thereof or the resistivity and other characteristics can be controlled.

Another object of this invention is to provide a crystal pulling method for growing a single crystal whose resistivity, for example, can be set within a desired range at high yield.

A crystal pulling apparatus having an integral type double crucible according to this invention, comprises a cylindrical separator wall (14) which is disposed in and is coaxial with a crucible (11) containing semiconductor material melt to divide the crucible (11) into inner and outer chambers (20, 21). A small hole (15) is formed in the separator wall (14), and a coupling tube (16) for connecting the inner chamber to the outer chamber, for example, a pipe-like passage supplied with the small hole (15), is provided. While a crystal is pulled and grown from the melt in the inner chamber (20) which has an impurity composition different from that of the melt in the outer chamber (21), material melt in the outer chamber (21) is being supplied to the inner chamber (20) via the coupling tube (16).

Thus, it is necessary for the coupling tube (16) of the integral type double crucible to permit easy transfer of the melt from the outer chamber (21) into the inner chamber (20) and at the same time inhibit the substantial outflow of impurity from the inner chamber (20) to the outer chamber (21).

(i) The length L of the coupling tube in this invention is set to satisfy the condition b>L>4a, where a is an inner diameter of the coupling tube (16), and b is an inner peripheral length ($2\pi r$) of the inner chamber (20). In a case where the condition L>4a is satisfied, a significant effect of suppressing the outflow of impurity from the inner chamber (20) to the outer chamber (21) can be attained irrespective of inner diameter a of the coupling tube (16) and independently of the rotation of the crucible (11). Further, in a case where b>L, the melt can be easily transferred from the outer chamber (21) to the inner chamber (20) during crystal pulling. The cross section of the coupling tube (16) may be rectangular or ellipse. In this case, the minor axis thereof is used as inner diameter a, and then the condition b>L>4a can be applied. Further, in the case where the inner diameter of the tube (16) is not constant (for example, tapered form), the average of the inner diameter over the entire length L is used as inner diameter a.

In the case where a silicon single crystal is pulled, (ii) if inner diameter a of the coupling tube (16) is set to satisfy a≧2 mm, the melt can be easily transferred during crystal pulling, and the outflow of impurity is inhibited when 30 mm>a. Further, (iii) if the temperature of the melt in the outer chamber near the outer portion of the separator wall (14) is set to be higher by at least 15° C. (preferably equal to or more than 30° C.) than that of the melt in the inner chamber (20) near the inner portion of the separator wall (14), crystal precipitation from the surface of the separator wall (14) can be prevented.

Assume that doped melt and undoped melt are respectively received in the inner and outer chambers, and the inner diameter of the crucible body (11) is 2R and the inner diameter of the cylindrical separator wall disposed coaxially with the crucible body is 2r and the condition (i) is satisfied. In this case, if (iv) r/R is selected so as to set apparent segregation coefficient $K_{eff}$ expressed by equation $k_{eff}=(R/r)^2 K$ to 1, the impurity concentration of the single crystal in the longitudinal direction is theoretically and practically set to be constant irrespective of the solidification ratio. The ratio r/R can be selected so as to set apparent segregation coefficient $K_{eff}$ to 1 or so as to set the characteristics including the resistivity of the single crystal (17) so that they can be controlled to be within a desired range.

Other features of this invention will be explained in respective embodiments.

BRIEF DESCRIPTION OF THE DRAWINGS

FIGS. 7A and 7B are illustrative views concerning the selection of the melt temperature in the method of this invention;

FIGS. 9 and 10 are graphs showing the characteristics obtained by the embodiment 2;

FIG. 15 is a plan view showing a modification of the apparatus shown in FIG. 2; and FIG. 16 is a schematic view of an apparatus having a construction for applying a magnetic field to the inner portion of the crucible.

DETAILED DESCRIPTION OF THE PREFERRED EMBODIMENTS

Figure 1:
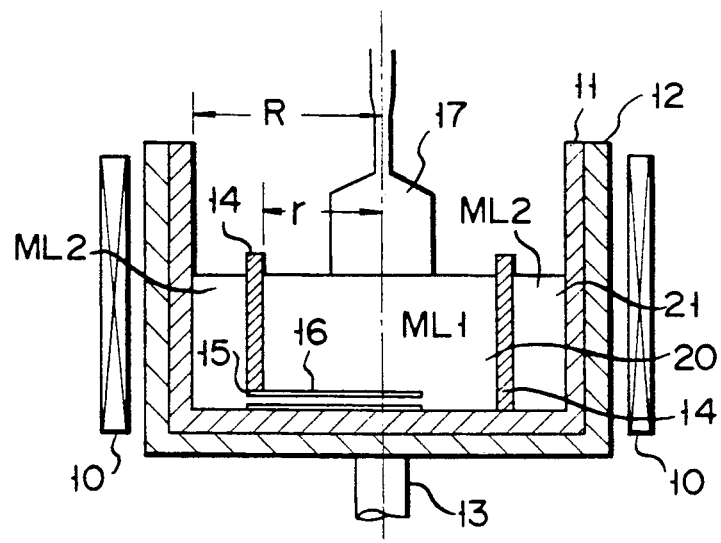
FIG. 1 is a conceptional cross sectional view of a crystal pulling apparatus used in an embodiment 1 of this invention.

FIG. 1 shows a crystal pulling apparatus used in one embodiment of this invention. For sake of brevity, a container of a pulling device for containing a hot zone including the crucible, a heat reserving cylinder and the like, which are well known in the art, are omitted here.

In FIG. 1, 12 denotes a graphite crucible mounted on vertically movable and rotatable crucible shaft 13, and 11 denotes an outer crucible formed of a quartz cylindrical container disposed in contact with the inner surface of graphite crucible 12. Outer crucible 11 is reinforced (or supported) by means of graphite crucible 12. Outer crucible 11 is heated by means of heater 10 disposed around crucible 11. Separator wall 14 formed of a quartz cylindrical container is disposed in outer crucible 11. Separator wall penetrating hole 15 is formed in separator wall 14, and quartz pipe-like coupling tube 16 which is supplied with hole 15 is mounted on wall 14. Cylindrical separator wall 14 is fixed by fusion on the inner bottom surface of outer crucible 14. The inner space of separator wall 14 constitutes inner chamber 20 for receiving melt ML1 and a space between separator wall 14 and outer crucible 11 constitutes outer chamber 21 for receiving melt ML2.

Figure 2A:
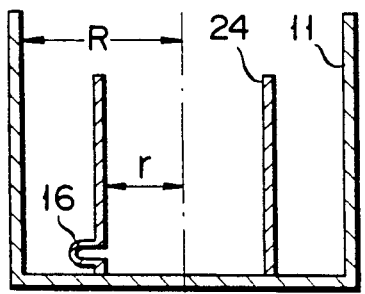
FIG. 2A shows a vertical sectional view along the line I—I in FIG. 2.
Figure 2B:
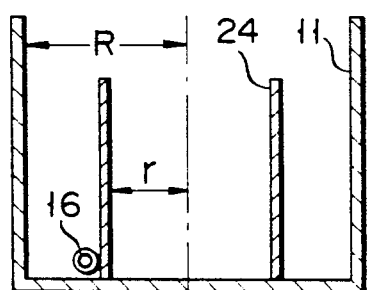
FIG. 2B shows a vertical sectional view along the line II—II in FIG. 2.
Figure 2:
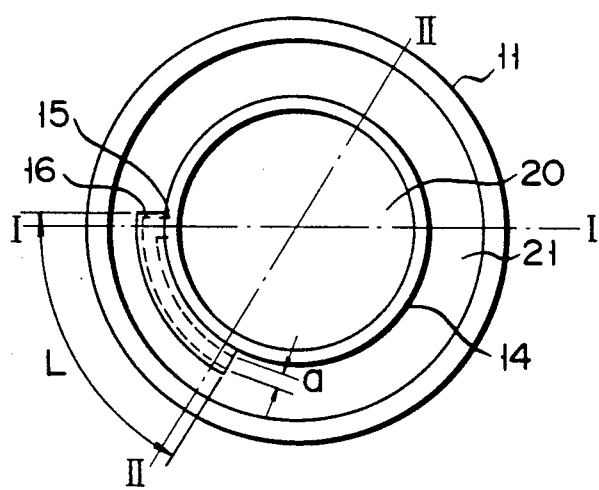
FIG. 2 is a plan view of the integral type double crucible of the apparatus shown in FIG. 1.

FIG. 2 is a plan view of crucible 11 of the apparatus shown in FIG. 1 in which separator wall 14 is fixed by fusion. In this embodiment, coupling tube 16 connects the inside of separator wall 14 to outer chamber 21 via small hole 15. Coupling tube 16 is mounted on the curved outer surface portion of separator wall 14 and fixed by fusion thereto, as shown by FIGS. 2A and 2B. Further, separation wall 14 can be formed in the cylindrical form as shown in FIGS. 1 and 2. However, as shown in FIG. 3, it is also possible to fix the bottom of inner crucible 24 formed of a cylindrical container on outer crucible 11 by fusion.

At this time, as shown in FIG. 15, coupling tube 16 is formed in conjunction with the inner portion of penetration hole 15 of separation wall 14 or inner chamber 20.

Figure 3:
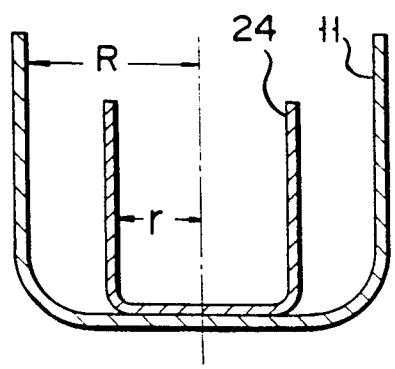
FIG. 3 is a vertical sectional view of another integral type double crucible used in the method of this invention.
Figure 4A:
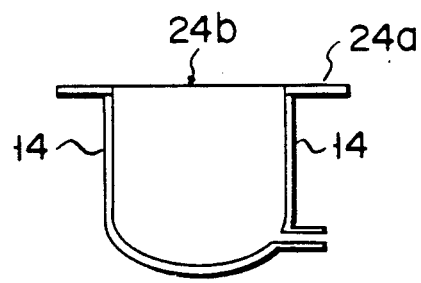
FIGS. 4A to 4E are vertical sectional views showing examples of the inner and outer crucibles which can be removably mounted.
Figure 4B:
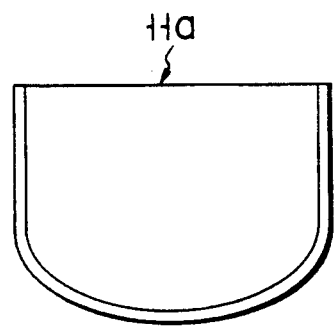
Figure 4C:
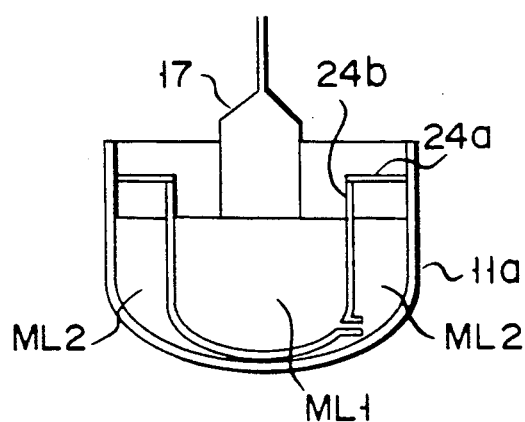
Figure 4D:
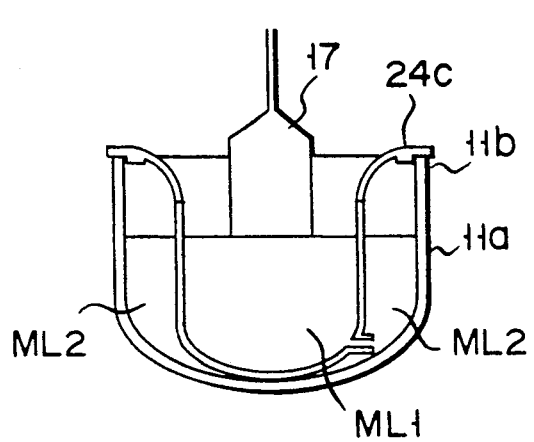
Figure 4E:
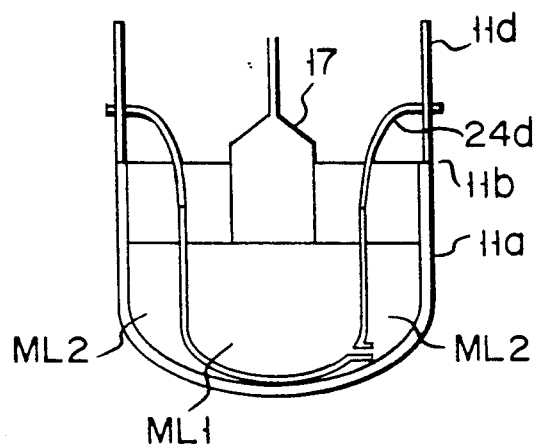

The ratio r/R of inner diameter 2r of inner crucible 24 and inner diameter 2R of outer crucible 11 of FIG. 3 can be varied in actual use. For this reason, it is effective to removably and coaxially mount inner crucible 24 on outer crucible 11 with the bottoms thereof set in contact with each other by means of a jig or the like, instead of fixing them together by fusion. In this case, for example, inner crucible 24b shown in FIG. 4A and outer crucible 11a shown in FIG. 4B can be combined. Inner crucible 24b has three or more positioning rods 24a which radially extend from the upper end with the tip ends thereof set in contact with the inner wall of the inner crucible. Then, as shown in FIG. 4C, crucible 11a can be removably and coaxially mounted on crucible 24a with the bottoms thereof set in contact with each other. It is also possible to place positioning rods 24c shown in FIG. 4D on upper end 11b of outer crucible 11a so as to removably mount the inner crucible on the outer crucible. Further, as shown in FIG. 4E, it is also possible to place positioning rods 24d by use of guide rods 11d set on upper end 11b of outer crucible 11a so as to removably mount the inner crucible on the outer crucible.

Figure 5:
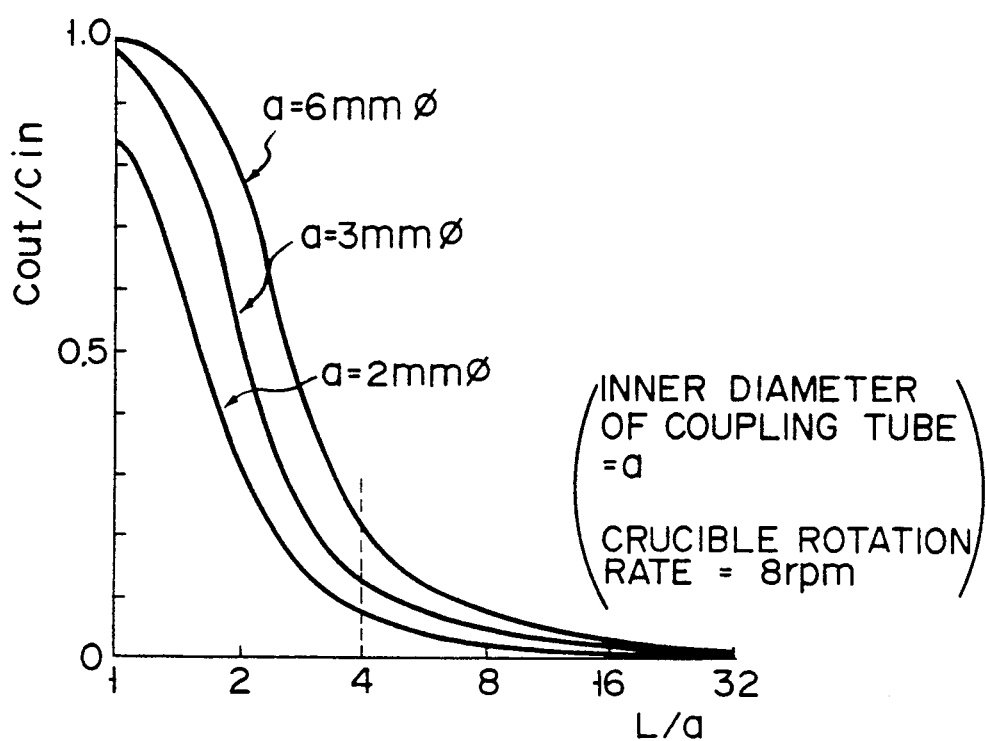
FIGS. 5 and 6 are graphs showing the relation between the concentration ratio (Cout/Cin) of melt and the dimensions of a coupling tube used in the method of this invention.

FIG. 5 shows the result of an experiment indicating the effect of impurity outflow suppression attained when inner diameter a and length L of coupling tube 16 are changed. The experiment was effected to check P concentration Cin in the inner crucible and P concentration Cout in the outer crucible after the melt process was completed under the condition that the outer crucible of $14''\phi$ and inner crucible of $8''\phi$, silicon material charge amount of 20 kg and crucible rotation of 8 rpm were used, and then phosphorus (P) was doped into the inner crucible and the crucible was continuously rotated for two hours. In FIG. 5, the ratio Cout/Cin is shown in the ordinate when L/a (abscissa) is varied from 1 to 32 with inner diameter a set to 2 mm, 3 mm and 6 mm.

Figure 6:
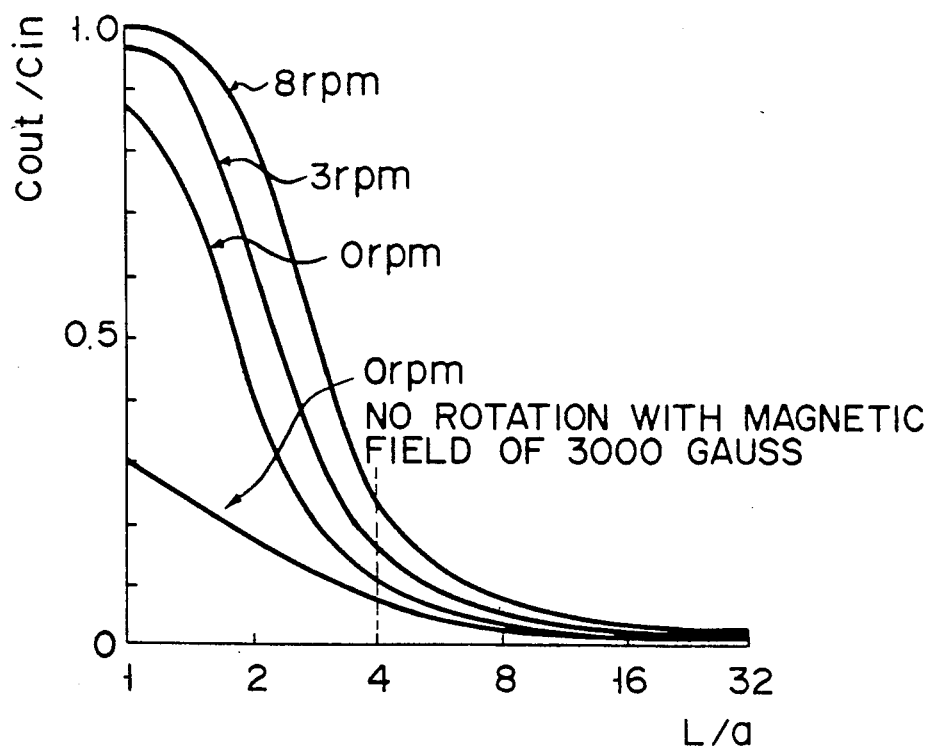

FIG. 6 shows the ratios Cout/Cin obtained by using the same crucible as used in the case of FIG. 5 and the same melt amount and dope amount as used in the case of FIG. 5. In this case, the ratios Cout/Cin are obtained after two hours have passed from the P doping in the melt with the rotation speed of inner crucible 11, having the coupling tube with the inner diameter a of 6 mm, set to 0 rpm, 3 rpm, and 8 rpm. And also the ratio Cout/Cin is obtained in condition that the rotation speed of inner crucible 11 is set to 0 rpm and the vertical magnetic field of more than 1500 gauss is applied. The magnetic field can be applied by use of electromagnet EM which is mounted to surround crucible 11 as shown in FIG. 16, for example.

Now, let us consider the result shown in FIG. 6. In general, forced convection due to the crucible rotation and thermal convection may occur in melts ML1 and ML2 in crucible 11. Since the silicon melt is electromagnetic fluid, the convection can be significantly suppressed by application of strong magnetic fields. Therefore, the weakest convection will be attained in that one of the four conditions shown in FIG. 6 in which the crucible rotation is 0 rpm and a magnetic field of 3000 gauss is applied. The convection becomes stronger in an order of 0 rpm, 3 rpm and 8 rpm. Outflow of impurity in melt ML1 in the inner chamber is caused by the direct replacement of melt via coupling tube 16 due to the convection occurring in crucible 11, that is, vortex and turbulence occurring near the inlet and outlet ports of coupling tube 16. Thus, it is clearly understood that the outflow of impurity is not largely dependent on the transfer of impurity due to simple impurity diffusion (Refer to Liverton, W.F. (1958), J.Appl. Phys, 29, 1241; Backwell, G.R. (1961), J.Electronics and Control, 10, 459). It can be determined from the results shown in FIGS. 5 and 6 that the direct replacement of the melt can be suppressed by setting L/a to be larger than approx. 4, preferably larger than 10.

It was further confirmed that, in the process of pulling silicon single crystal 17, coupling tube 16 was clogged by the softening and deformation of quartz material when inner diameter a of coupling tube 16 was 1 mm. With inner diameter a of 2 mm, melt could be supplied with difficulty, and with inner diameter a of 3 mm, it was possible to steadily supply the melt. When inner diameter a was set to be larger than 30 mm, the effect of suppressing the outflow of impurity could not be observed even if L/a was set to be larger than 4.

FIG. 7A shows the distribution of surface temperature of silicon melt in outer chamber 21 and inner chamber 20 in the silicon single crystal pulling process. In a case where temperature difference $\Delta T$ between the temperatures of the melts in the inner and outer chambers near the separation wall is small, projection crystal 20a grows from separation wall 14 as shown in FIG. 7B. When $\Delta T$ was set to be 5° C. and 10° C., the projection crystal was observed in all the five experiments. When ΔT was set to be 15° C., the projection crystal was observed in two out of five experiments and was not observed in the remaining three experiments. When ΔT was set to be 20° C., the projection crystal was observed in one out of five experiments and was not observed in the remaining four experiments. Further, when ΔT was set to be 30° C., the projection crystal was not observed in the experiments. Therefore, in order to steadily pull silicon single crystal, it will be necessary to set the temperature of melt in the outer chamber near the separation wall to be at least 15° C. (preferably more than 30° C.) higher than the temperature of the melt in the inner chamber.

As shown in FIGS. 1 to 3, the number of chambers for receiving material melt in the integral type double crucible is two which is different from that (one) used in the conventional CZ technique but is the same as that (two) used in the conventional floating type double crucible. However, in the floating type double crucible, the inner and outer chambers are arranged in upper and lower positions respectively. In contrast, in the integrated type double crucible shown in FIGS. 1 to 3, inner chamber 20 and outer chamber 21 are arranged in substantially the same height level. Further, in the floating type double crucible, the surface level of the melt in the inner crucible is kept constant as described before. In contrast, in the integral type double crucible shown in FIGS. 1 to 3, the surface level of melt ML1 subjected to the pulling process in the inner chamber is set substantially equal to that of melt ML2 in the outer chamber by means of coupling tube 16. However, the surface level of melt ML1 in the inner chamber during the crystal pulling process is gradually lowered and cannot be kept constant.

The feature of the integral type double crucible of this invention resides in that inner chamber 20 and outer chamber 21 are divided by concentric cylindrical separation wall 14 and coupling tube 16 is provided to suppress outflow of impurity from inner chamber 20 to outer chamber 21 As shown in FIGS. 1 to 3, the feature can be attained irrespective of the fact that the surface level of melt ML1 in the inner chamber is set equal to that of melt ML2 in the outer chamber and the surface level of melt subjected to the pulling process in the inner chamber is kept constant

EMBODIMENT 1

With this embodiment, the manner of controlling the impurity concentration of donor and acceptor in the longitudinal direction of a crystal is explained.

Assume first that melt ML2 in the outer chamber of the crucible of a crystal pulling apparatus of the construction shown in FIG. 1 is undoped, the inner diameter of outer crucible 11 is 2R, and the inner diameter of separation wall 14 is 2r. At this time, the segregation of dopant impurity in crystal 17 pulled from doped melt ML1 in inner chamber 20 is determined based on apparent segregation coefficient $K_{eff}$ which can be expressed as follows.

$$K_{eff} = (R/r)^2 k \quad (2)$$

Since segregation coefficient k of general impurity is less than 1 (for example, k of P, B and Si is 0.35, 0.80, and 0.023), it is possible to set $K_{eff}$ to a value which is equal to or near 1 by selectively setting inner diameter 2r of separation wall 14 to a proper value. $K_{eff}$ of 1 means that the impurity concentration (resistivity in the case of low resistance) in a longitudinal direction of the crystal is constant.

In a case where $K_{eff} = 1$, equation (2) can be rewritten as follows.

$$r = \sqrt{k} \cdot R \quad (3)$$

In the case where the impurity concentration distribution in the longitudinal direction of the crystal to be pulled is controlled to be uniform, it is necessary to keep melt ML2 in outer chamber 21 undoped as the practical condition of this invention. Therefore, the condition $L \geq 4a$ for coupling tube 16 explained in FIGS. 5 and 6 was selected in which, even if no substantial movement of melts ML1 and ML2 occurs between inner chamber 20 and outer chamber 21 at the time of melting or neck-down process, for example, outflow of impurity from melt ML1 in inner chamber 20 to melt ML2 in outer chamber 21 can be prevented. For setting up this condition, inner diameter a and length L of coupling tube 16 were respectively set to be 4 mm and 50 mm. In this case, outer chamber 11 of 12"ϕ with the silicon charge amount of 14 kg was used, inner radius r of cylindrical separation wall 14 was set to be approx. 0.6R ($\sqrt{k} = 0.6$ because segregation coefficient k of P is 0.35), and silicon single crystal with resistivity of 5 to 6Ω.cm, 4"ϕ, and growth orientation (111) was grown by use of material melt ML1 doped with P in the same manner as in the CZ technique.

Figure 8A:
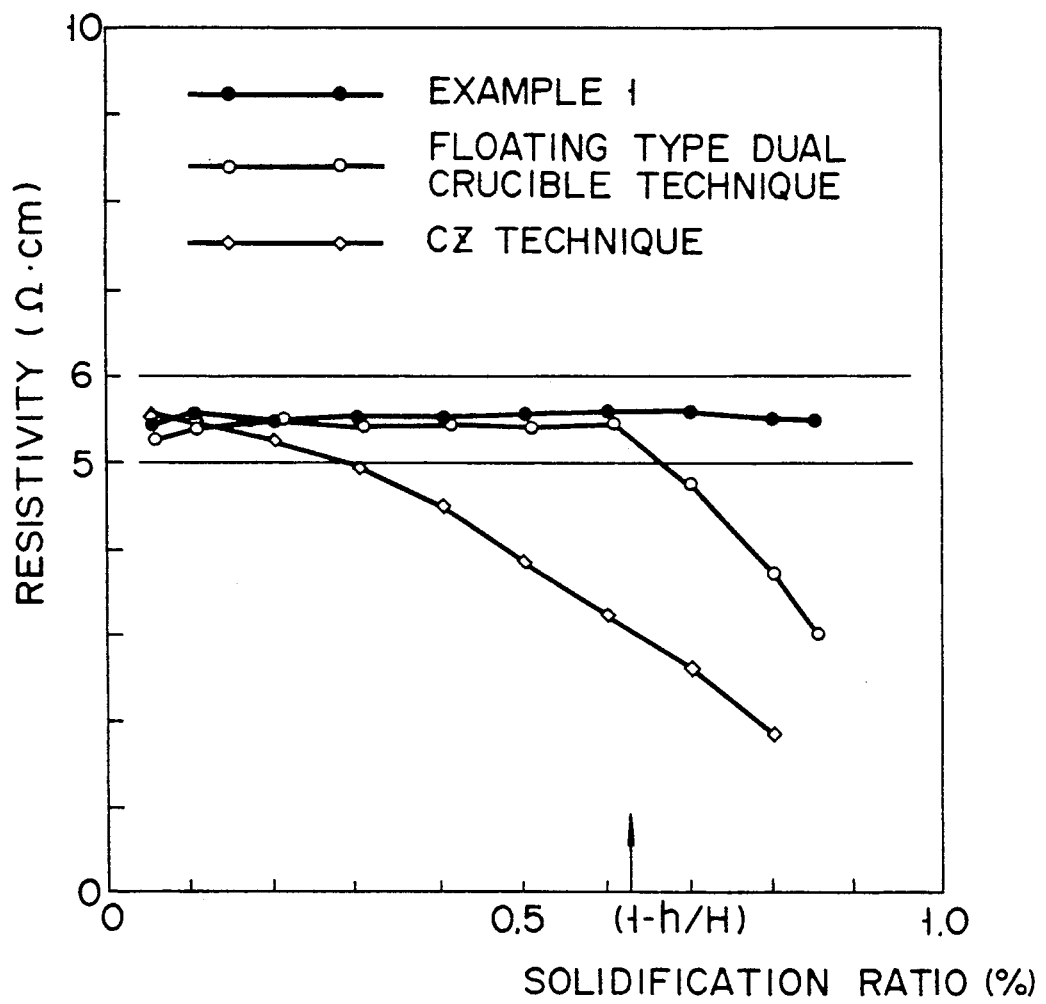
FIGS. 8A and 8B are graphs showing the characteristics obtained by the embodiment 1.
Figure 8B:
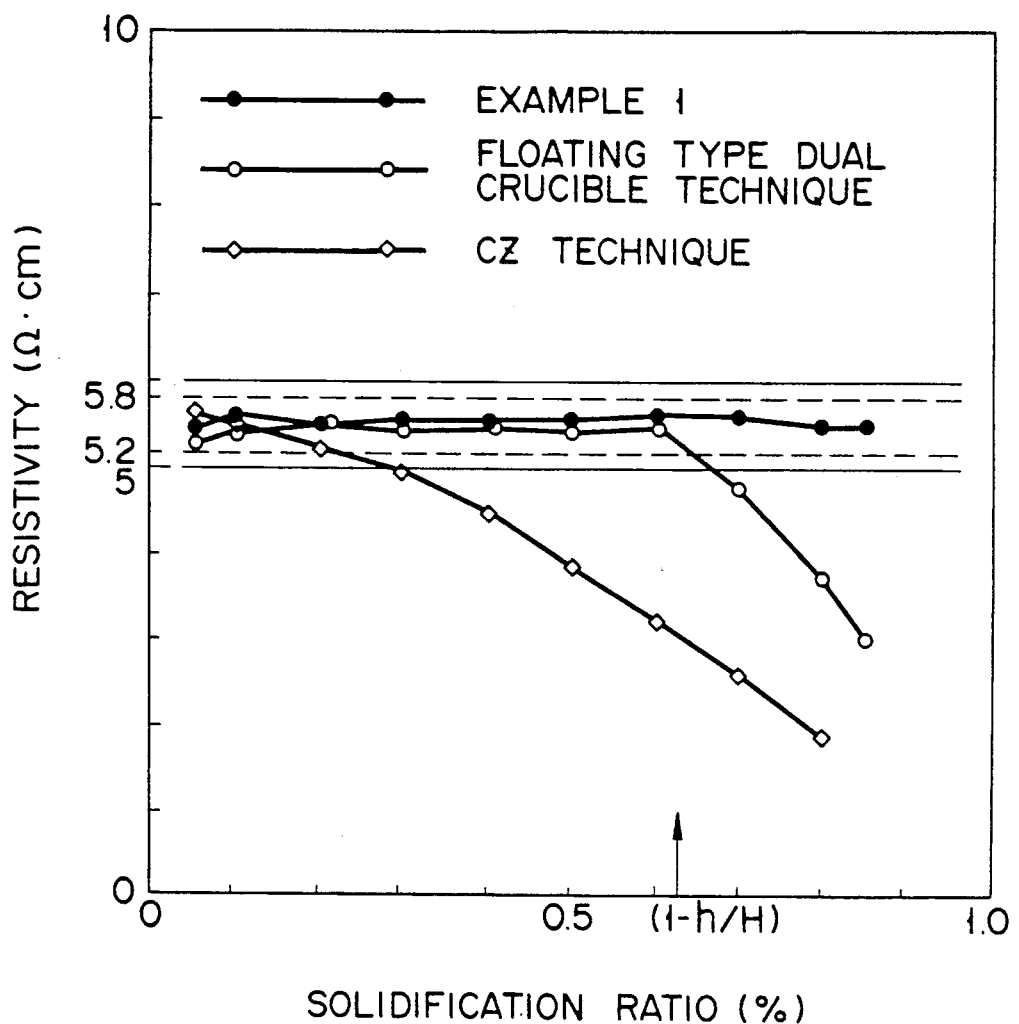

Each of FIGS. 8A and 8B shows the relation between the solidification ratio (abscissa) and the resistivity (ordinate) of the crystal obtained in this embodiment by mark ○ together with those obtained by the conventional floating type double crucible method (by mark ●) and conventional CZ technique (mark ◊). In order to obtain wafers within such a narrow resistivity range, the solidification ratio must be less than 30% in the conventional CZ technique and less than 60% (less than the solidification ratio of 1−h/H) in the conventional floating type double crucible method. In contrast, in this invention, the narrow resistivity range can be obtained in the entire length of the single crystal.

It was confirmed that the in-plane resistivity distribution Δρ of the wafer obtained in this embodiment was 6 to 15%, superior to that of the wafer attained by the FZ technique which is 15 to 50%, and substantially the same as that of the wafer attained by the CZ technique.

EMBODIMENT 2

The requirements for the quality of crystal include not only the resistivity range but also the oxygen concentration range. In this embodiment, the concentrations of oxygen and conductive impurity P are controlled within the range of P doped resistivity of 7.5 to 12Ω.cm and the range of oxygen concentration of 1.45 to $1.85 \times 10^{18}$ atoms/cc.

In general, the oxygen concentration becomes high when a relatively large crystal is pulled from a small crucible. A measurement was made to check the relation between the resistivity (FIG. 9) and the oxygen concentration (FIG. 10) with respect to the solidification ratio with the ratio r/R set at 0.6, 0.7, 0.8, 0.9 and 1.0 (the case wherein the ratio r/R is set at 1.0 corresponds to the ordinary CZ technique in which no double crucible is used). The yield relating to the resistivity which is represented by the yield of effective material expressed by (the weight of specified good article)/(- specification-free possible weight) shown in Table 1 was obtained.

TABLE 1

| r/R | 0.6 | 0.7 | 0.8 | 0.9 | 1.0 |
|---|---|---|---|---|---|
| Yield of Effective Material (%) | 100 | 90.7 | 71.9 | 61.6 | 56.8 |

Figure 9:
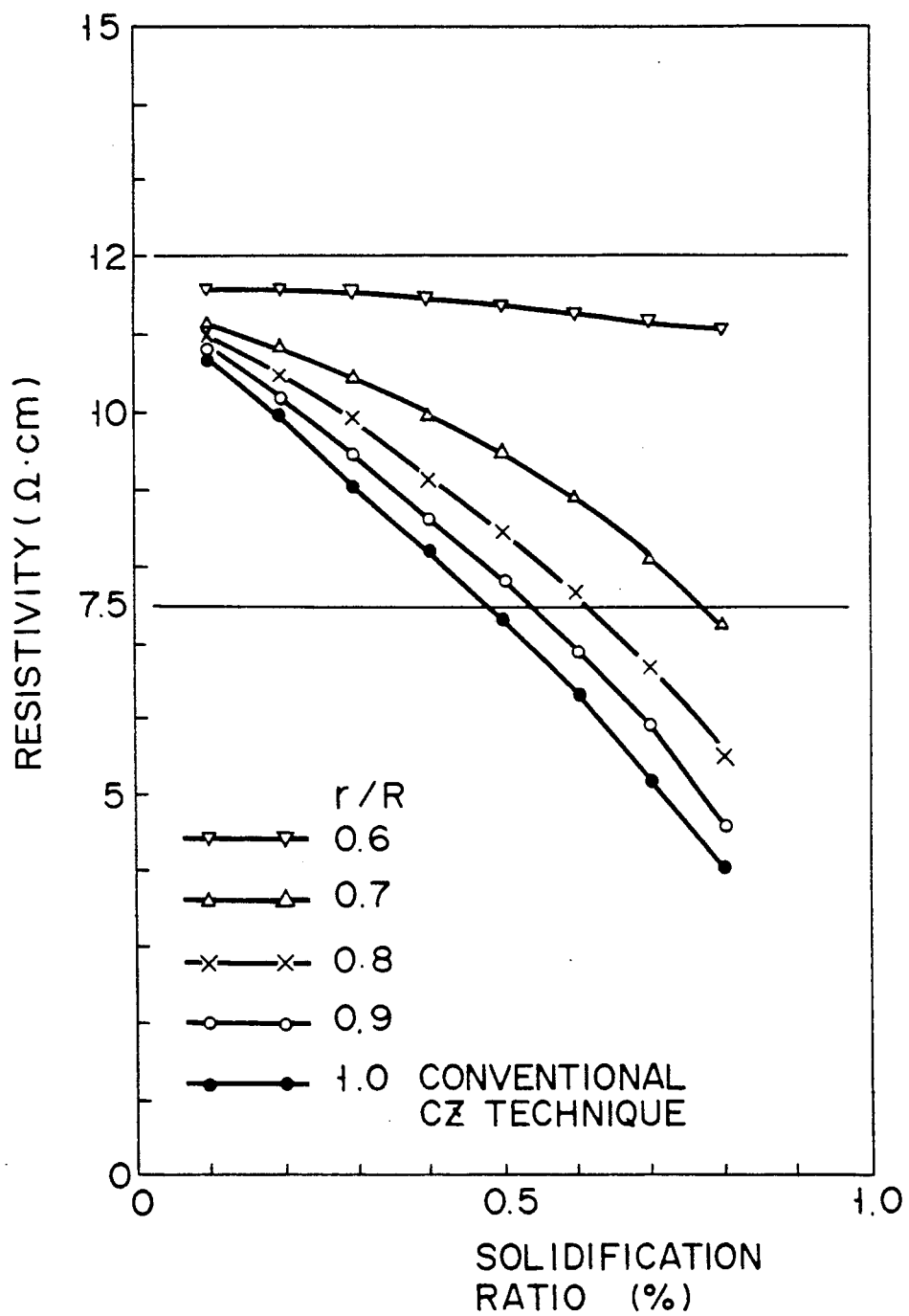

As is clearly seen from the results of FIGS. 9 and 10, the resistivity in the longitudinal direction becomes constant under the condition that $r/R = \sqrt{k} \approx 0.6$ as is explained in embodiment 1. However, the resistivity and oxygen concentration can be set within the desired range in the condition that $r/R = 0.7$ (in this case, the yield of effective material is 90.7%). Thus, when apparent segregation coefficient $K_{eff}$ is set to as close to 1 as possible by selecting the proper value of r/R based on the measurement data, the resistivity and oxygen concentration can be set into the desired range at a relatively high percentage (r/R = 0.67 is optimum and in this case the yield is approx. 100%).

The ratio r/R is selectively set based on not only impurity such as oxygen which is different from the dopant but also the crystal growing condition. When crucible 20 of a diameter which is relatively large (preferably more than twice) with respect to that of a crystal 17 is used, crystal of good quality can be easily obtained. Therefore, in a case where it is permitted to set the resistivity within a certain desired range, a crystal of good quality can be easily grown by setting r to be as large as possible within the range of $K_{eff}$ corresponding to the desired resistivity range.

EMBODIMENT 3

In this embodiment, when a crystal defect is introduced into the crystal, the material melt is set back to the initial condition and pulled again. Also, in this case, the effect of the integral type double crucible having coupling tube 16 which can suppress the outflow of impurity from inner chamber 20 to outer chamber 21 can be attained (Japanese Patent Disclosure Nos. 55-47300, 61-261288, 56-104796, and 62-56399 are prior art).

Figure 11:
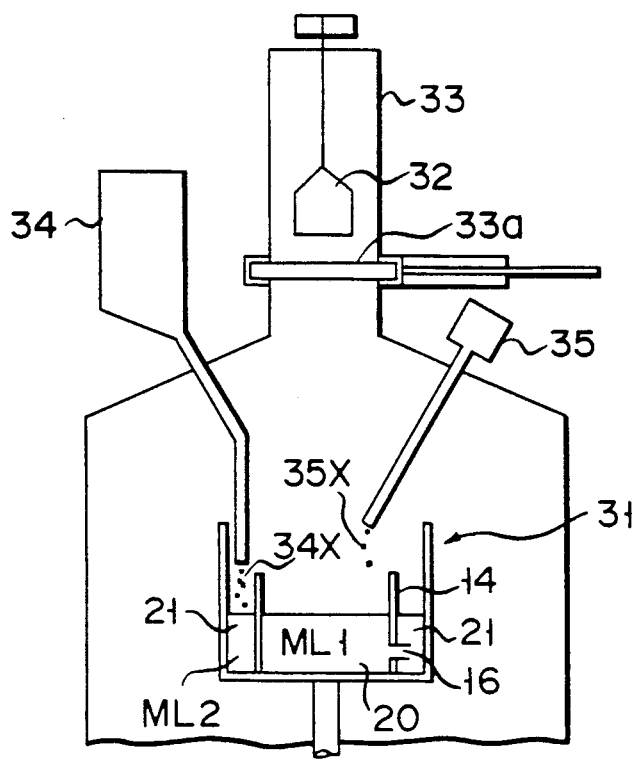
FIG. 11 is a sectional view of the main portion of the crystal pulling apparatus used in embodiment 3.

FIG. 11 is a conceptional view of the apparatus used in embodiment 3. In FIG. 11, 31 denotes an integral type double crucible of 16"ϕ which can receive a melt of 35 kg. The crucible includes cylindrical separation wall 14 of 10"ϕ (because of phosphorus doping, the value of 10"/16" is set substantially equal to root mean square $\sqrt{k}(\approx 0.6)$ of segregation coefficient k), and coupling tube 16 having inner diameter a of 6 mm and length L of 100 mm. 32 denotes a crystal in which a dislocation has erroneously occurred, 33 a pull chamber which can be separated by means of gate valve 33a, 34 a hopper for introducing undoped material 34x, and 35 a supply unit for introducing doped material 35x.

Assume that the phosphorus impurity concentration of melt ML1 in the inner chamber is Co and melt ML2 in the outer chamber is undoped. Since a dislocation occurred in crystal 32 when crystal 32 of 5"ϕ was pulled by W kg (5 kg), the pulling operation was interrupted and crystal 32 was received into pull chamber 33. Further, gate valve 33a was closed, crystal 32 was removed and the seed crystal was set again.

Next, after undoped material of W kg was introduced into outer chamber 21 of crucible 31 via hopper 34 and melt there, dopant of 624 mg with the impurity concentration of $1 \times 10^{19}$ atoms/cc corresponding to the dopant amount ($kC_oW/\rho$; $\rho$ is the specific weight of solid Si) in removed crystal 32 was supplied into inner chamber 20 via supply unit 35, thus setting the melt condition to the initial condition. Then, the crystal pulling operation was effected again and dislocation-free crystal of 5"ϕ and 31 kg was obtained. It took 5 hours to start the pulling operation again after the pulling of dislocation crystal 32 was interrupted and the dislocation crystal was collected.

For reference, the integral type double crucible method (called one-shot technique) in which the re-pulling operation is not effected and the pulling operation by melt back technique (defective crystal of 5 kg is returned, melt and pulled again) using the integral type double crucible were effected under the same condition in other respects as in this embodiment.

Figure 12:
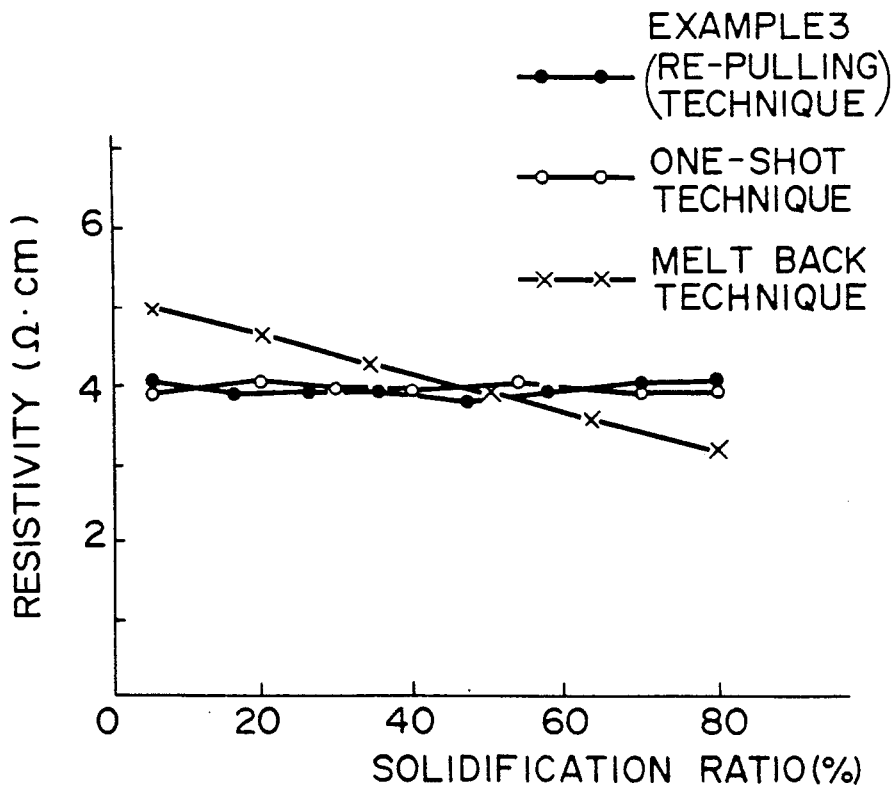
FIG. 12 is a graph showing the characteristics obtained by the embodiment 3.

FIG. 12 shows the resistivity with respect to the solidification ratio of the crystal obtained by the above three pulling methods. It is understood from the results shown in FIG. 12 that since the suppression effect of impurity outflow by coupling tube 16 which satisfies the condition L/a > 10 is sufficiently large, substantially the same degree of uniformity of the resistivity as that obtained in the case of one-shot technique in which the re-pulling operation is not effected can be maintained even if the re-pulling operation is effected for a long time with the integral type double crucible. When, in the pulling operation in the integral type double crucible, the melt back technique which is frequently used in the conventional CZ technique is used, melt in the inner chamber flows out into the outer chamber because of the melt back, thus making it impossible to attain the resistivity which is constant in the longitudinal direction of the crystal.

Figure 13A:
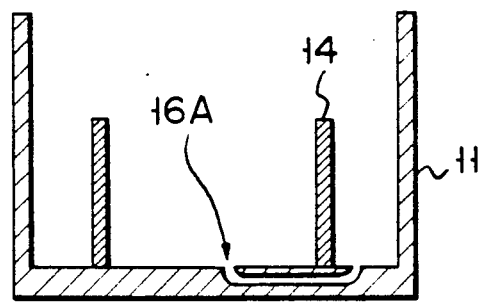
FIGS. 13A and 13B are vertical sectional views of still another integral type double crucible used in the method of this invention.
Figure 13B:
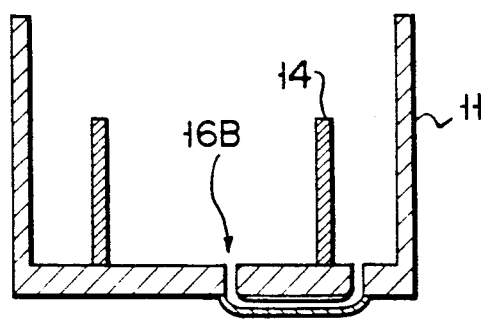
Figure 14:
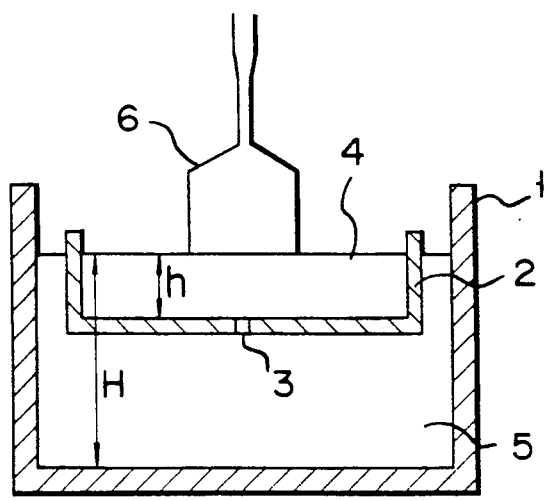
FIG. 14 is a vertical sectional view of the main portion of a conventional floating type double crucible pulling apparatus.

The embodiments of this invention have been described above, but this invention is not limited to these embodiments. The technical ideas concerning coupling tube 16 for suppression of impurity outflow and r/R selected to obtain $K_{eff}$ equal to or near 1 can be variously modified. For example, the position and shape of coupling tube 16 can be freely determined, and coupling tube 16A formed in the bottom portion of crucible 11 shown in FIG. 13A and coupling tube 16B formed outside the bottom portion of crucible 11 shown in FIG. 13B can be used. The material of crucible 11, separation wall 14 or coupling tube 16 can be heat resistant material such as PBN (Pyrolytic Boron Nitride), $Si_3N_4$, or SiC other than quartz, or can be quartz coated with PBN, $Si_3N_4$, or SiC. It is also possible to form a plurality of small holes 15 and pipelike passages 16 as the coupling tube. Further, this invention can be applied to a mechanism other than the coupling tube for coupling outer chamber 21 with inner chamber 20 without departing from the technical idea of this invention that r/R is selected to set $K_{eff}$ to be equal to or near 1.

According to this invention, there is provided a practically effective crystal pulling method using an integral type double crucible in which the condition that b > L ≧ 4a and 30 mm > a > 2 mm for coupling tube 16 used in the integral type double crucible method, and ΔT > 15° C., are set for pulling a Si single crystal. Thus, outflow of impurity from inner chamber 20 to outer chamber 21 can be reliably suppressed. Further, doped melt ML1 and undoped melt ML2 are respectively received in inner chamber 20 and outer chamber 21, and are communicated by means of a coupling tube which satisfies the condition b > L > 4a. By properly selecting r/R, $K_{eff}$ may be set equal to or near 1. As a result, the yield relating to the resistivity of pulling crystal can be enhanced to approximately 100%, or the yield can be significantly enhanced in comparison with the prior art case by controlling the resistivity and other characteristics.

What is claimed is:

1. A crystal pulling apparatus comprising:
    an outer crucible with radius R, for receiving a first material melt;
    an inner crucible coaxially disposed in said outer crucible, for receiving a second material melt, said inner crucible having inner peripheral length b and radius r equal to substantially $\sqrt{k}$ times the radius R where the segregation coefficient of dopant included in the second material melt is k and k does not equal zero; and
    coupling means having length L and an inner diameter a, for permitting the first material melt to flow in one direction, from said outer crucible to said inner crucible, wherein b > L > 4a; and
    magnetic field means for generating a magnetic field greater than 1500 Gauss.

2. An apparatus according to claim 1, wherein said coupling means includes a hole formed in the outer wall on the bottom side of said inner crucible and a pipe having an effective length of L and provided with said hole, and the first material melt in said outer crucible can flow into said inner crucible via said pipe and hole.

3. An apparatus according to claim 1, wherein said inner crucible has positioning means for positioning said inner crucible coaxially with and inside said outer crucible and said inner crucible can be removably mounted on said outer crucible.

4. An apparatus according to claim 1, wherein coupling means includes a hole formed in the outer wall on the bottom side of said inner crucible and a pipe having an effective length L and inner diameter a and provided with said hole; and said inner crucible constitutes a separation wall for separating the second material melt, received in said inner crucible, from the first material melt; the first material melt is an undoped silicon melt and the second material melt is a doped silicon melt; and the apparatus includes means for maintaining the temperature of the first material melt near said separation wall higher by substantially at least 15° C. than that of the second material melt near said separation wall.

5. An apparatus according to claim 1, wherein said coupling means includes a hole formed in the outer wall on the bottom side of said inner crucible and a pipe having an effective length L and inner diameter a and provided with said hole; and said inner crucible constitutes a separation wall for separating the second material melt, received in said inner crucible, from the first material melt; the first material melt is an undoped silicon melt and the second material melt is a doped silicon melt; and the apparatus includes means for maintaining the temperature of the first material melt near said separation wall higher by substantially at least 30° C. than that of the second material melt near said separation wall.

6. An apparatus according to claim 4, wherein the inner diameter a of said pipe is substantially smaller than 30 mm and larger than 2 mm.

7. An apparatus according to claim 1, wherein the material of said inner and outer crucibles includes quartz.

8. An apparatus according to claim 1, wherein the material of said inner and outer crucibles includes any one of Pyrolytic Boron Nitride, $Si_3N_4$, and SiC.

9. A crystal pulling method comprising the step of pulling semiconductor crystal from a material melt in an inner chamber, said material melt in said inner chamber having impurities therein, while material melt received in an outer chamber is being supplied to said inner chamber via a coupling tube provided between said inner and outer chambers which are divided in a semiconductor crystal pulling crucible by a cylindrical separation wall coaxially provided in said crucible, characterized in that the length L of said coupling tube is set to satisfy the condition $b > L \geq 4a$ where the inner diameter of said coupling tube is a and the inner peripheral length ($2\pi r$) of said inner chamber is b, while suppressing melt convection by applying a magnetic field greater than 1500 Gauss.

10. A crystal pulling method according to claim 9, wherein the semiconductor material of the material melt and crystal is silicon, the material of said crucible and separation wall is quartz, and the inner diameter a of said coupling tube is set to satisfy the condition 30 mm > a ≦ 2 mm.

11. A crystal pulling method according to claim 10, further including the step of setting the temperature of the melt in said outer chamber near said separation wall higher by at least 15° C. than that of the melt in said inner chamber near said separation wall, and the crystal pulling operation is effected.

12. A crystal pulling method according to claim 9, wherein an inner crucible which is placed inside said crucible body is removably and coaxially mounted in said crucible body, with the bottom portion thereof set in contact with said crucible body, and the side wall of said inner chamber is used as said separation wall.

13. A crystal pulling method comprising the step of pulling a semiconductor crystal from a melt doped with dopant of segregation coefficient k and received in an inner chamber while undoped melt received in an outer chamber is being supplied to said inner chamber via a coupling tube provided between said inner chamber via a coupling tube provided between said inner and outer chambers which are divided in a semiconductor crystal pulling crucible by a cylindrical separation wall coaxially provided in said crucible, characterized in that the length of L of said coupling tube is set to satisfy the condition $b > L \geq 4a$ where the inner diameter of said coupling tube is a and the inner peripheral length of said inner chamber is b; and the ratio r/R, where r is the radius of said cylindrical separation wall and R is the radius of said crucible, is selected to set apparent segregation coefficient $k_{eff} = (R/r)^2 k$ to 1 or as close to 1 as possible, while suppressing melt convection by applying a magnetic field greater than 1500 Gauss.

14. A crystal pulling method according to claim 13, wherein dopant is additionally introduced into said inner chamber in the semiconductor crystal pulling process, after the semiconductor crystal is removed from a processing chamber, and undoped material is additionally melted in said outer chamber, to resume the initial condition, and then semiconductor crystal is again pulled.

15. A crystal pulling apparatus comprising:
    a cylindrical crucible body having a radius R, for receiving a first material melt;
    a cylindrical separation wall disposed in and coaxial with said crucible body, for receiving a second material melt separately from the first material melt, said separation wall having a radius r which is k times the radius R and inner peripheral length $2\pi r$ where the segregation coefficient of dopant included in the second material melt is k and k does not equal zero;

unidirectional transferring means having a length L and an inner diameter a, and mounted on the wall surface of said separation wall on the bottom side of said crucible body, for transferring the first material melt substantially in one direction from said crucible body to said inner crucible, provided that $2\pi r > L \geq 4a$; and magnetic field means for generating a magnetic field greater than 1500 Gauss.

16. An apparatus according to claim 15, wherein the first material melt is undoped silicon melt in which substantially no conductive impurity is doped, and the second material melt is doped silicon melt in which a conductive impurity is doped; and the apparatus includes means for maintaining the temperature of the first material melt near said separation wall higher by substantially at least 15° C. than that of the second material melt near said separation wall.

17. An apparatus according to claim 15, also including means for heating said crucible body to keep the temperature of the first material melt near said separation wall higher by substantially at least 30° C. than that of the second material melt near said separation wall.

18. An apparatus according to claim 16, wherein the inner diameter a of said unidirectional transferring means is substantially smaller than 30 mm and larger than 2 mm.

19. An apparatus according to claim 15, wherein the material of said inner crucible and crucible body includes quartz.

20. An apparatus according to claim 15, wherein the material of said inner crucible and crucible body includes any one of Pyrolytic Boron Nitride, $Si_3N_4$, and SiC.

21. A crystal pulling apparatus, said apparatus comprising:

an outer crucible for receiving an undoped silicon melt, said outer crucible having a radius R;

and inner crucible coaxially disposed in said outer crucible for receiving a doped silicon melt, said inner crucible having inner peripheral length b and radius r equal to substantially $\sqrt{k}$ times the radius R, where k is the segregation coefficient of dopant included in the doped silicon melt and k does not equal zero;

coupling means for permitting the undoped silicon melt to flow in one direction from said outer crucible to said inner crucible, said coupling means having a length L and an inner diameter a, wherein $b > L \geq 4a$; and magnetic field means for generating a magnetic field greater than 1500 Gauss.

* * * * *